May 15, 1962 E. I. DOUCETTE 3,035,186
SEMICONDUCTOR SWITCHING APPARATUS
Filed June 15, 1959 3 Sheets-Sheet 1

INVENTOR
E. I. DOUCETTE
BY H. W. Lockhart
ATTORNEY

INVENTOR
E. I. DOUCETTE
BY H. W. Lockhart
ATTORNEY

May 15, 1962 E. I. DOUCETTE 3,035,186

SEMICONDUCTOR SWITCHING APPARATUS

Filed June 15, 1959 3 Sheets-Sheet 3

INVENTOR
E. I. DOUCETTE
BY H. D. Lockhart
ATTORNEY

United States Patent Office 3,035,186
Patented May 15, 1962

3,035,186

SEMICONDUCTOR SWITCHING APPARATUS

Edward I. Doucette, Summit, N.J., assignor to Bell Telephone Laboratories, Incorporated, New York, N.Y., a corporation of New York Filed June 15, 1959, Ser. No. 820,546
3 Claims. (Cl. 307—88.5)

This invention relates to semiconductor devices of the field effect type and, more particularly, to semiconductor structures suitable for performing switching or logic functions.

Basic forms of field effect devices are described in U.S. Patent 2,744,970, issued May 8, 1956, to W. Shockley and U.S. Patent 2,778,956, issued January 22, 1957, to G. C. Dacey and I. M. Ross. In one form, a field effect device comprises a semiconductor body having a main zone of one conductivity type defining a majority carrier current channel having a source electrode at one end and a drain electrode at the other. Between the source and drain electrodes, the body further includes a pair of control zones of the opposite conductivity type contiguous with the main zone and forming extended PN junctions therewith along a region intermediate between the source and drain connections. The electrode connections to these control zones are denoted as gate connections.

As is known, when the PN junctions are biased in the reverse direction a space charge region is formed which extends into the main zone an amount which is determined by the magnitude of the reverse bias across the junctions. Because a space charge region acts as a high resistance region, the voltage applied across the PN junctions controls the conductance of the channel which serves as the path of majority carrier flow between the source and drain connections.

In accordance with this invention, each control zone of a field effect device is biased from a separate source whereby the conductance of the main zone is determined by the presence or absence of a reverse bias voltage across one or both of the PN junctions. Thus, a field effect element comprising a main zone and a pair of opposed control zones provides a switching element having two input connections and one output connection and thereby is suitable for use as an inhibiting gate for logic switching.

In particular, an AND circuit is provided if the bias on each of the two control electrodes is such that when a control pulse is applied to each of the two control electrodes, the element exhibits a low impedance between source and drain; and in the absence of a control pulse on each of the two control electrodes, the element exhibits a high impedance between source and drain.

Alternatively, an OR circuit is provided if the bias on each of the two control electrodes is such that when a control pulse is applied to either or both of the two control electrodes, the element is switched from a high impedance state to a low impedance state.

Further, it is in accordance with this invention to provide a plurality of field effect elements each having a pair of opposed control zones, all within one semiconductor body.

It is also in accordance with this invention to include in one integrated device one or more resistance elements of the field effect varistor type, similar, for example, to those disclosed in the application of E. I. Doucette, H. A. Stone, Jr., and R. M. Warner, Jr., Serial No. 700,319, filed December 3, 1957, now Patent No. 2,954,486, granted September 27, 1960.

Therefore, an object of this invention is an improved semiconductor switching device.

Another object is a semiconductor switching device including several separate stages within a single semiconductor body. Thus, an integrated semiconductor device in accordance with this invention has improved performance capabilities and increased flexibility of operation.

One embodiment in accordance with this invention comprises a body of semiconductor material of one conductivity type having source and drain electrodes at opposite ends of the body. Interposed between the source and drain electrodes are a series of three majority current channels defined between three pairs of control zones of opposite conductivity-type material. Thus, a semiconductor body in the form of an elongated wafer has a series of equi-spaced transverse striplike zones in both major faces of the wafer. Each face has three such control zones, or a total of six for the body. A substantially ohmic or low resistance electrode is applied to each control zone and a suitable electrical connection is made to each such electrode. Each of these connections constitutes an input to the switching device.

For operation as a switching element, the source electrode at one end of the body is connected at ground potential and the drain electrode is connected to a source of voltage for inducing majority current flow therethrough. Considering only a single pair of control zones as forming a single stage or element of a semiconductor switching device, if a zero bias voltage condition exists across both control zone junctions, this stage of the device is a low impedance element offering only the body resistance of the material to a majority current flow. If sufficient reverse bias voltage is applied across both contral zone junctions to produce extended space charge regions in the current channel therebetween, this stage of the device becomes a substantially high impedance element. Typically, the reverse bias voltage applied will be sufficient to produce space charge regions which touch each other in a condition defined as pinch-off. On the other hand, if such a reverse bias voltage is applied across only one of the control zone junctions, the impedance level increases only by a small factor over its zero bias condition which is negligible compared to the impedance level produced at pinch-off, and the element remains substantially a low impedance element.

Thus, if the normal state of a two-control zone field effect element is defined as the high impedance condition produced by reverse biasing the control zone junctions, then, if the bias is changed on either one or the other of the control zone junctions so that it is no longer reverse biased, the element changes to a low impedance. On the other hand, if the normal state of the element is the low impedance resulting from zero bias voltage on both control connections, then, if both control zone junctions are reverse biased, the element changes to high impedance condition.

Therefore, an advantage of integrated switching devices in accordance with this invention is the smaller number of electrical connections required, since all internal connections between individual elements are within the semiconductor body and thus inherent in the integrated structure.

Another advantage of the integrated structures is their relative ease of fabrication using well-known solid state masking and diffusing techniques.

One feature of this invention is the combination of field effect transistor elements and the field effect current limiter to provide a device having a lesser degeneration of the signal being switched compared to more conventional devices using diodes and various passive elements.

Another feature of the integrated field effect device of this invention is the provision of a field effect element comprising opposed gate regions of one conductivity type disposed so as to isolate electrically certain portions of an integrated device.

The invention and its other advantages and features will be more clearly understood from a consideration of the following description taken in connection with the drawings in which.

In the drawings certain dimensions have been exaggerated to provide greater clarity. Wherever appropriate, as between the several figures, like reference numbers have been used to denote like parts of the device.

Figure 1:
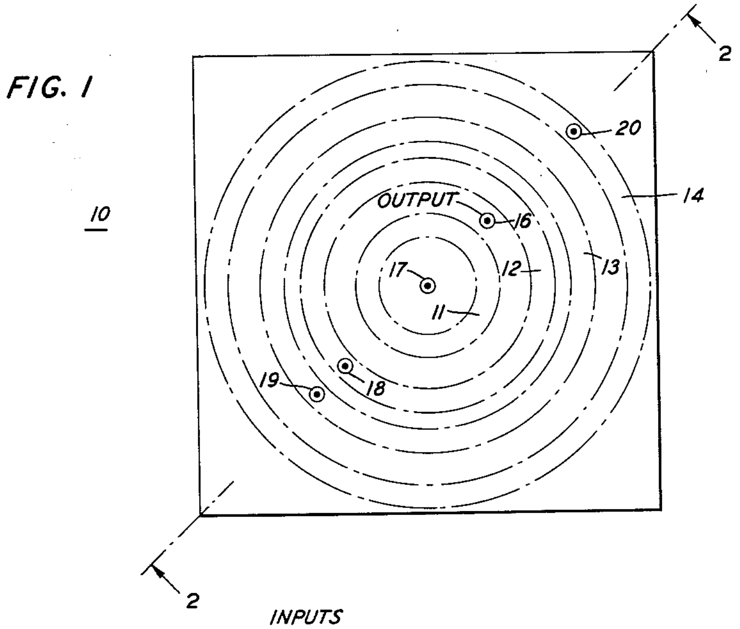
FIGS. 1 and 2 are, respectively, plan and sectional elevation views of a switching device in accordance with this invention comprising a series arrangement of field effect elements.
Figure 2:
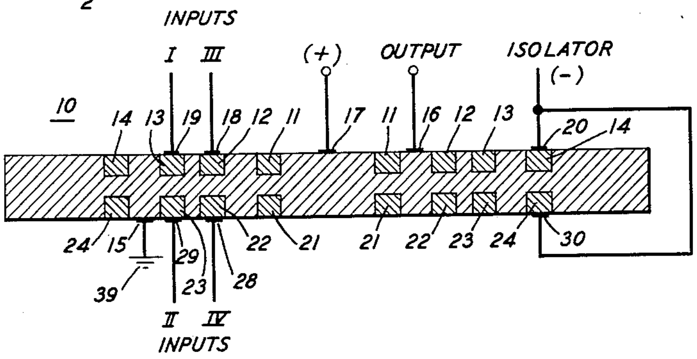

The device shown in FIGS. 1 and 2 comprises a wafer of semiconductor material, more specifically, of single crystal silicon whose bulk portion has a resistivity of 50 ohm-centimeters, N-type. The wafer is about .25 inch square and .003 inch thick. A series of annular P-type conductivity regions are provided in both faces of the wafer to a depth of .001 inch and a width, likewise, of about .001 inch. The rings of each pair are in opposed relation so as to provide an approximately one mil thick channel of original N-type material between their innermost boundaries. Taken from the center outwardly, the opposing rings 11 and 21 in combination with the adjacent body portion provide the field effect current limiter element. The next two pairs of annular rings 12—22 and 13—23 are the field effect transistor control zones or gate regions for accomplishing the switching functions. The outermost pair of rings 14—24 provides a means of electrically isolating the entire array from other devices. An electrode 15, which serves a role analogous to the source electrode of a field effect transistor, is applied to the wafer within the isolating ring and connected to ground potential 39. An electrode 17 within the current limiter ring 11 is connected to a source of positive voltage to induce majority carrier current flow. Electrodes 18—28 and 19—29 are connected to the transistor element control zones 12—22 and 13—23, respectively, and constitute the input control connections of the switching device. The control voltage on each control zone junction is applied across the particular input connection and the ground electrode 15. The ground electrode maintains the N-type portion of the body at ground potential. The terminals I, II, III and IV are denoted input terminals in the sense that negative pulses applied or not applied thereto determine the flow of majority carrier current (electrons in N-type material) from the ground electrode 15 to the output electrode 16. The isolater ring 14—24 is connected to a potential source through common connections to the electrodes 20 and 30. Thus, the output of the device is taken at electrode 16 attached to the wafer outside of the current limiter ring.

Figure 3:
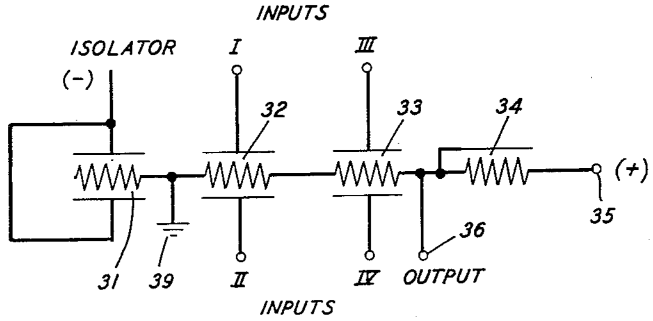
FIG. 3 is an electrical diagram of the device of FIGS. 1 and 2.

Thus, as shown in the diagram of FIG. 3, the device of FIGS. 1 and 2 is shown in symbolic form as a series arrangement consisting of the first field effect transistor element 32 representing the element defined by P-type rings 13—23 having separate input terminals I and II, a second field effect transistor element 33 representing the element defined by P-type rings 12—22 having terminals III and IV and the output electrode 36. The serially arranged transistor switching elements 32 and 33 are connected at the one end to a ground connection 39 and at the other end to an output connection 36, representing the electrode 16 of FIGS. 1 and 2. Connected in parallel with the output connection is a field effect limiter 34 representing the element defined by the P-type conductivity regions 11—21. The connection 35 to a source of positive potential for inducing majority carrier current flow represents the electrode 17 at the center of the wafer. Disposed outside of the entire array and therefore in parallel connection with the connection to ground is the isolator element 31 representing the P-type rings 14—24. As indicated, both control zones of the isolator element are connected in common to a source of negative potential of sufficient magnitude to produce the pinch-off condition.

The device depicted in FIGS. 1 and 2 is fabricated from a wafer having the suggested dimensions and of N-type conductivity material having, typically, a resistivity of 50 ohm-centimeters by using the photoresist and oxide masking method disclosed in the application of J. Andrus, Serial No. 678,411, filed August 15, 1957. After producing a diffusion mask over the entire wafer, except for the surfaces that coincide with the annular rings, the wafer is subjected to a boron diffusion treatment in accordance with the methods disclosed in U.S. Patent 2,802,760, issued August 13, 1957, to L. Derick and C. J. Frosch. Using a boron trichloride diffusion, a treatment at 1300 degrees centigrade for 12 hours produces the desired one mil diffusion penetration. The various electrical connections are attached to plated metal electrodes using the thermo-compression bonding technique disclosed in the application of O. L. Anderson and H. Christensen, Serial No. 619,639, filed October 31, 1956.

Figure 4:
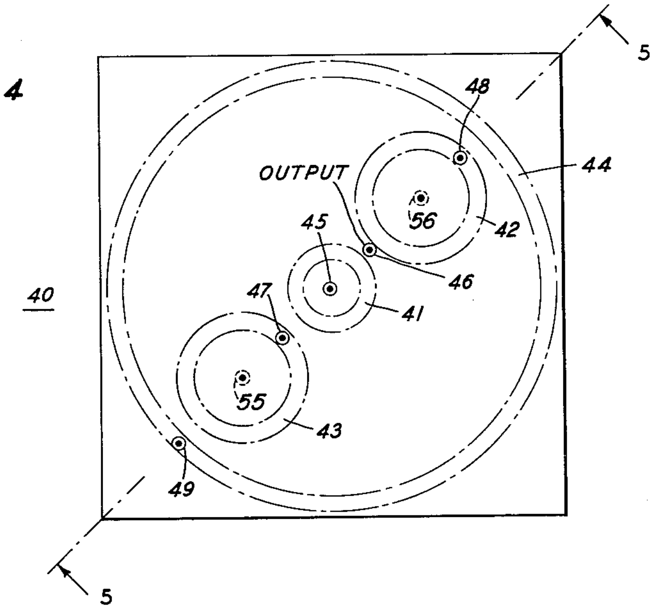
FIGS. 4 and 5 are, respectively, plan and sectional elevation views of a semiconductor switching device comprising a parallel array of field effect elements.
Figure 5:
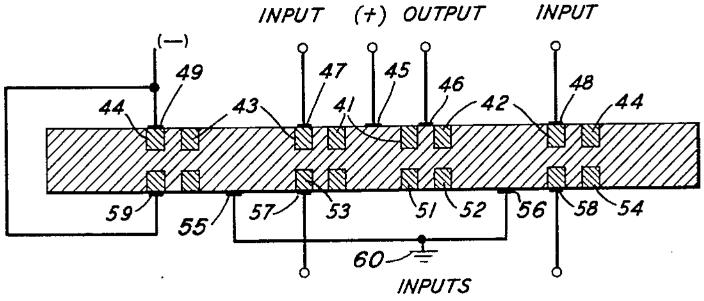

In a generally similar fashion but using a different geometry pattern, the device depicted in FIGS. 4 and 5 provides an arrangement of two field effect switching elements connected in parallel with each other and applied to a load comprising a field effect varistor. As in the series array of FIGS. 1, 2 and 3, P-type regions 44 and 54 provide an isolation element and innermost annular rings 41—51 constitute the field effect varistor which provides a load. Interposed therebetween, but separate and not concentric, are transistor elements represented by the P-type control zones 42—52 and 43—53. An electrode 45 connected within the ring representing the field effect varistor is connected to a source of positive potential and the electrodes 55—56 at the center of transistor elements 42—52 and 43—53, respectively are connected to ground potential 60. A common lead connects the electrodes 49 and 59 of the isolating element 44—54 to a negative biasing source for producing the cut-off condition and the electrodes 47, 48, 57 and 58 connected to each of the transistor element control zones constitute the input electrodes for the switching device. A connection to the electrode 46 applied to the N-type material outside of all the elements except the isolator ring constitutes the output connection for the switching device.

Although the foregoing embodiments have been described in terms of devices having N-type channels and P-type control regions, it will be understood that these materials may be reversed to provide P-type channels and requiring additionally a polarity reversal of the various bias voltages.

Figure 6:
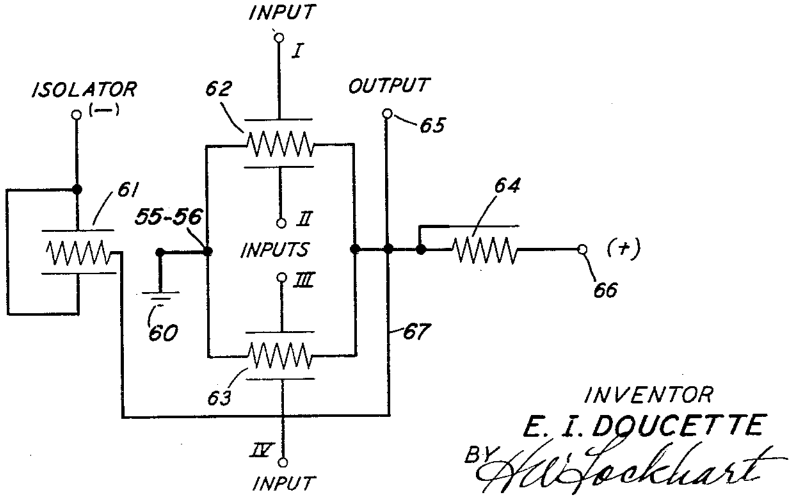
FIG. 6 is an electrical diagram of the device of FIGS. 4 and 5.

As shown in the diagram of FIG. 6, which has the same relation to the device of FIGS. 4 and 5 as does the diagram of FIG. 3 to the device of FIGS. 1 and 2, starting from the lefthand end, the electrode 55—56 analogous to a source electrode is connected to ground potential 60. Next in order is the parallel array of the two transistor switching elements 62 and 63. This array, in turn, is connected through the field effect varistor 64 to a terminal 66 at a positive potential and also to the output connection 65. As shown by the lead 67, the isolator 61 is connected at the same potential as the output connection 65 through the body of the wafer.

An analysis of the various forms of operation of the foregoing disclosed structures suggests the flexibility and versatility of devices in accordance with this invention. Considering the series array shown in the circuit diagram of FIG. 3, if the normal condition is defined as one of zero bias at the terminals designated I, II, III and IV, the device is in the low impedance condition and majority carrier current will flow from the ground electrode 15 to the output electrode 16. The device changes to a high impedance unit if the reverse bias condition is applied to terminals I and II or to terminals III and IV, or to any three or more of the terminals. On the other hand, if the several control zone junctions are normally reverse biased, the unit presents a high impedance and it will change to the low impedance condition if two of the junctions, not opposite one another, change to the zero bias condition, or if any three or more junctions are changed to a zero bias. It will be noted that the capabilities of switching devices of this type may be vastly increased by the addition of more field effect elements in series or parallel arrangements or in combinations of both types of configuration.

The two-element parallel array shown in the circuit diagram of FIG. 6 is capable, likewise, of exhibiting several switching conditions. If terminals I, II, III and IV are normally at a potential so as to provide a zero bias condition across the several control zone junctions, the device will exhibit a low impedance. The device will remain in the low impedance condition as long as any one gate junction remains zero biased. Conversely, if the four control zone junctions are normally reverse biased to provide a high impedance device, changing any one of the four control zone junctions to a zero bias condition will change the device to a low impedance.

The foregoing described series and parallel arrangements of field effect switching elements represent the basic building blocks for providing more complex and versatile switching arrangements. In such arrangements the exemplary isolating rings 14—24 of FIGS. 1 and 2 and 49—59 of FIGS. 4 and 5 are most useful for electrically isolating elements in one portion of an integrated device from the remainder of the device. For example, the devices of FIGS. 1 and 4 may be combined in one single wafer, or a single wafer may contain several series arrays in combination with several parallel arrays of field effect switching elements, and isolating rings may be suitably provided for electrically separating the various branches of the switching circuit arrangement. As has been suggested heretofore, the fabrication of such devices having greater complexity is readily accomplished using photoresist and oxide masks which are capable of reproducing detailed and complex patterns on semiconductor material.

Figure 7:
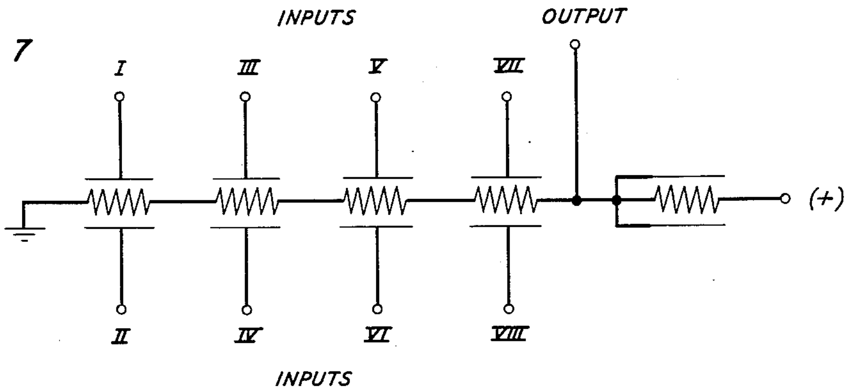
FIG. 7 is an electrical diagram of a series array of four switching elements.

As an example of the versatility and simplification of integrated semiconductor switching devices in accordance with this invention, a multiple field effect device, as shown in FIG. 7, comprising a series array of four field effect elements in a single slice of silicon and including a field effect varistor as a nonlinear load will perform functions which in a diode logic system would require 12 diodes, five resistors and a relatively large number of wire interconnections. This series array is similar to the device of FIGS. 1, 2 and 3 with the addition of two more switching elements and without the isolating element.

Figure 8:
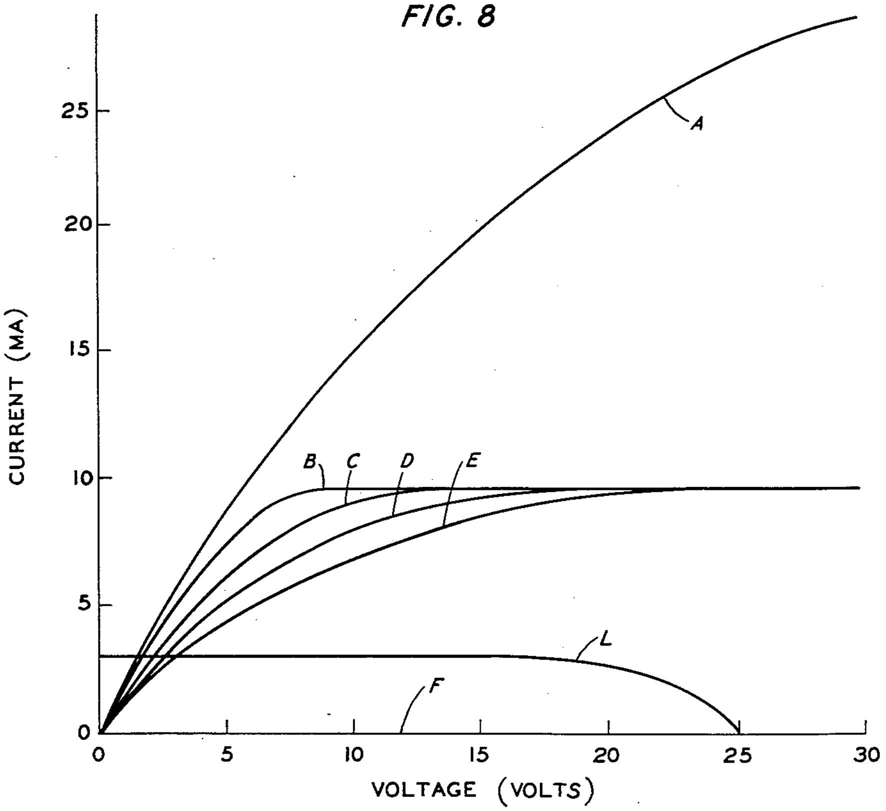
FIG. 8 is a graph showing the current-voltage characteristics for the device of FIG. 7.

Turning to the graph of FIG. 8 which illustrates the current-voltage characteristic of the device of FIG. 7, curve A represents the response of the device with no reverse biases applied to any of the terminals I, II, III, IV, V, VI, VII or VIII. This is the extreme low impedance condition. Curve B depicts the response with reverse bias applied to one terminal of one gate element, curve C the characteristic with reverse bias on one terminal of two of the elements, curve D represents reverse bias on one terminal of three elements, and curve E on one terminal of all four elements. Curve F, which substantially coincides with the no-current condition results from the application of reverse bias across both control zone junctions of any one switching element. The output naturally follows the limiter load line L and switches from about three volts to about 25 volts at cut-off. Thus, the signal strength holds up well compared to the relatively rapid signal degeneration usually observed in diode logic systems.

Although the invention has been described in terms of several specific embodiments, it will be understood that these are but illustrative and that other arrangements may be devised by those skilled in the art which also will be within the scope and spirit of the invention.

What is claimed is:

1. An integrated semiconductor device for accomplishing logic switching functions comprising a semiconductor body substantially of one conductivity type having two opposed major surfaces, said body including adjacent to each said major surface a plurality of annular control regions of the opposite conductivity type, each said control region defining a PN junction with a portion of said body of one conductivity type, each of said control regions in one major surface being in registration with a control region of like configuration in said other major surface and defining therebetween a majority carrier current channel, a low resistance connection to each of said control regions in each major surface, a pair of spaced apart low resistance connections to said body of one conductivity type, first voltage means for applying to said pair of connections a voltage so as to induce majority carrier current flow through said channels in said body and a plurality of voltage sources for applying selectively to each low resistance connection of said annular regions of opposite conductivity type a voltage which biases the PN junction of said region either in the reverse direction at a value corresponding to the pinch-off condition or substantially at zero.

2. An integrated semiconductor device in accordance with claim 1 in which said annular regions of opposite conductivity type are concentric thereby providing a series arrangement of majority carrier current channels.

3. An integrated semiconductor device in accordance with claim 1 in which said annular regions of opposite conductivity type are separated and not concentric and in which the second of said pair of connections to said body of one conductivity type comprises a plurality of low resistance connections within the boundary of each said annular region thereby providing parallel arrangement of majority carrier current channels.

References Cited in the file of this patent

UNITED STATES PATENTS

| | | |
|---|---|---|
| 2,648,805 | Spenke | Aug. 11, 1953 |
| 2,744,970 | Shockley | May 8, 1956 |
| 2,754,431 | Johnson | July 10, 1956 |
| 2,801,348 | Pankove | July 30, 1957 |
| 2,836,797 | Ozarow | May 27, 1958 |
| 2,851,615 | Sziklai et al. | Sept. 9, 1958 |
| 2,864,006 | Vandeven | Dec. 9, 1958 |
| 2,900,531 | Wallmark | Aug. 18, 1959 |
| 2,901,638 | Huang | Aug. 25, 1959 |

FOREIGN PATENTS

| | | |
|---|---|---|
| 1,037,293 | France | Sept. 15, 1953 |